(12) United States Patent
Gu (10) Patent No.: US 6,320,921 B1
(45) Date of Patent: Nov. 20, 2001

(54) FAST ACQUISITION CLOCK RECOVERY USING A DIRECTIONAL FREQUENCY-PHASE DETECTOR

(75) Inventor: Richard X. Gu, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/160,905

(22) Filed: Sep. 25, 1998

Related U.S. Application Data

(60) Provisional application No. 60/060,349, filed on Sep. 29, 1997.

(51) Int. Cl.[7] .................................................. H03D 3/24
(52) U.S. Cl. .......................... 375/376; 375/375; 327/148
(58) Field of Search ..................... 375/376, 375, 375/374, 294, 362, 327; 327/147, 148, 149, 156, 157, 158, 236, 244; 329/307

(56) References Cited

U.S. PATENT DOCUMENTS

| | | | |
|---|---|---|---|
| 5,850,422 | * 12/1998 | Chen | 375/371 |
| 6,009,134 | * 12/1999 | Yoon | 375/376 |
| 6,011,822 | * 1/2000 | Dreyer | 375/376 |
| 6,127,865 | * 10/2000 | Jefferson | 327/149 |
| 6,225,927 | * 5/2001 | Scott et al. | 341/110 |

* cited by examiner

Primary Examiner—Chi Pham
Assistant Examiner—Emmanuel Bayard
(74) Attorney, Agent, or Firm—J. Dennis Moore; W. James Brady, III; Frederick J. Telecky, Jr.

(57) ABSTRACT

A phase-locked loop circuit is disclosed. The phase-locked loop circuit includes a fundamental/quadrature phase comparator circuit (12) that compares an input bitstream (IN) to fundamental and quadrature phases of an output clock signal (CLK, CLKQ), to generate logic signals (I1, I2) corresponding to the state of the output clock signal phases at the time of each transition of the input bitstream. Compare logic (44) in the fundamental/quadrature phase comparator circuit (12) generates anticlockwise (A) and clockwise (C) signals to a state machine (14), in response to the logic signals (I1, I2) varying from a prior state (X1, X2) in opposing directions in a sequence; the sequence and directions are indicative of the polarity of the error frequency between the input bitstream and the output clock signal. Beginning with the first comparison and in response to the anticlockwise (A) and clockwise (C) signals, the state machine (14) issues a high gain charge or discharge signal (UPC, DNC) to a charge pump filter (20), to raise or lower the voltage ($V_n$) at a capacitor (25) and thus increase or decrease the oscillation frequency of a voltage-controlled oscillator (30) that generates the output clock signal (CLK). This charge or discharge operation continues until the opposite one of the anticlockwise (A) and clockwise (C) signals is produced by the compare logic (44), at which time the state machine begins issuing lower gain discharge or charge signals (DND, UPD) to correct the output clock frequency in the opposite direction, in a fine correction manner.

12 Claims, 5 Drawing Sheets

FAST ACQUISITION CLOCK RECOVERY USING A DIRECTIONAL FREQUENCY-PHASE DETECTOR

This application claims priority under 35 USC 119(e)(1) of provisional application No. 60/060,349 filed Sep. 29, 1997.

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of electronic circuits, and is more specifically directed to phase-locked loops as used in data communications.

As is well known in the art, the receipt of communicated digital signals in modern communication systems, whether for voice, video, or data, often requires the generation of a clock signal from the received digital signals. This process of clock generation, particularly from a data bitstream in which the logic states vary from cycle to cycle, is referred to in the art as "clock recovery" or "clock extraction". The clock signal that is recovered from the input signal stream is conventionally used to synchronize receiver-end signal processing circuitry with the incoming signal.

In conventional systems, phase-locked loops (PLLs) are generally used to recover a clock signal from an incoming bit stream. As is fundamental in the art, PLLs typically include a phase/frequency detector that compares the incoming signal against the current state of a generated clock signal, and generates a voltage in response to the phase relationship between the two. The voltage is applied, after filtering (e.g., by charge-pumping a capacitor in a low-pass filter) and amplification as desired, to a voltage-controlled oscillator (VCO). The VCO generates the clock signal at a frequency that varies with the voltage from the phase/frequency detector, and forwards this clock signal to the processing circuitry and to the phase/frequency detector. As the frequency and phase of the clock signal approach that of the incoming bit stream, the PLL operation stabilizes at a steady state (i.e., a "locked" condition).

PLL design and functionality is relatively straightforward when the input signal is itself periodic. However, PLL synchronization with an input bitstream of varying data is somewhat more complex, as the input signal is not strictly periodic but will, of course, depend upon the actual data being communicated. For example, assuming a duty cycle of on the order of 50%, an input bitstream of all "1" states will appear as a periodic signal of the maximum frequency; conversely, an input bitstream of random (from the viewpoint of the PLL) "0" and "1" states will not be strictly periodic, but will appear as cycles of varying frequency. The clock recovery circuitry must, of course, be capable of both locking onto such an input bitstream and also maintaining a relatively steady output clock signal.

Difficulties in clock recovery from an input bitstream are exacerbated in modern communication systems, particularly those operating over fiber optic facilities at bit rates in the GHz range. In particular, the ability of clock recovery circuitry to rapidly lock onto the underlying frequency of the bitstream, maintain a steady output clock frequency, and reject noise, becomes more important with increasing data rates.

By way of further background, a conventional phase and frequency detector integrated circuit is described in Pottbäcker, et al., "A Si Bipolar Phase and Frequency Detector IC for Clock Extraction up to 8 Gb/s", *J. Solid State Circuits*, Vol. 27, No. 12 (IEEE, Dec. 1992), pp. 1747–1751. As described therein, a capacitor is charged or discharged, in charge-pump fashion, according to the phase relationship of the input signal to the recovered clock (both its fundamental and a quadrature phase). However, in this approach, the charge and discharge pulses are dependent upon the input data pattern, and not merely its frequency; it is believed that this dependence will cause pull-out out even at a small frequency difference especially if a series of "1" level bits are received. In addition, the capacitor is charged and discharged in a discontinuous fashion according to this approach, resulting both in a relatively slow "pull-in" (or "lock-in") time from a large error frequency, and also in uncontrollable jitter at small error frequencies.

Another conventional clock recovery approach, referred to as a "rotational frequency detector", is described in Wolaver, *Phase-Locked Loop Circuit Design* (Prentice Hall, 1991), pp. 177–183. The rotational frequency detector relies upon a comparison of the input signal to fundamental and quadrature phases of the recovered clock signal to determine which one of four possible phase relationship "quadrants" corresponds to each edge of the input signal. The direction (i.e., clockwise or counterclockwise) in which successive input signal edges travel through a repeating sequence of these four quadrants indicates whether the input frequency is greater or less than that of the recovered clock. It has been observed, however, that the rotational frequency detector, similarly as the Pottbäcker approach, charges and discharges the low-pass filter capacitor discontinuously, again resulting in long pull-in times and also jitter. Furthermore, it is apparent from the Wolaver reference that the rotational frequency detector is relatively inefficient in detecting clock slips, and also in utilizing all available rotational information; these inefficiencies are reflected in clock signal inaccuracies and also in long response times.

BRIEF SUMMARY OF THE INVENTION

It is an object of the present invention to provide a frequency/phase detector in which lock-in time is minimized.

It is a further object of the present invention to provide such a frequency/phase detector which provides a high degree of lock-in accuracy in combination with small lock-in time.

It is a further object of the present invention to provide such a frequency/phase detector which is not dependent upon the incoming data states in reaching lock-in.

It is a further object of the present invention to provide a phase-locked loop circuit having such a frequency/phase detector.

Other objects and advantages of the present invention will be apparent to those of ordinary skill in the art having reference to the following specification together with its drawings.

The present invention may be implemented into a phase-locked loop integrated circuit having a charge pump circuit for charging and discharging a capacitor in response to a frequency/phase detector circuit. The capacitor voltage is applied to an input of a voltage controlled oscillator to generate the recovered clock. The frequency/phase detector is realized as a state machine that receives logic signals corresponding to the relationship of the input signal to fundamental and quadrature phases of the output recovered clock signal. The state machine detects the rotational direction of a large error frequency and controls a charge pump to rapidly modulate the output clock frequency in response to the detected direction, until a change in rotational direction is detected. Once the change in rotational direction is detected, slower modulation of the clock frequency is effected responsive to the detected phase relationship of the input signal and the recovered clock.

DETAILED DESCRIPTION OF THE INVENTION

Figure 1:
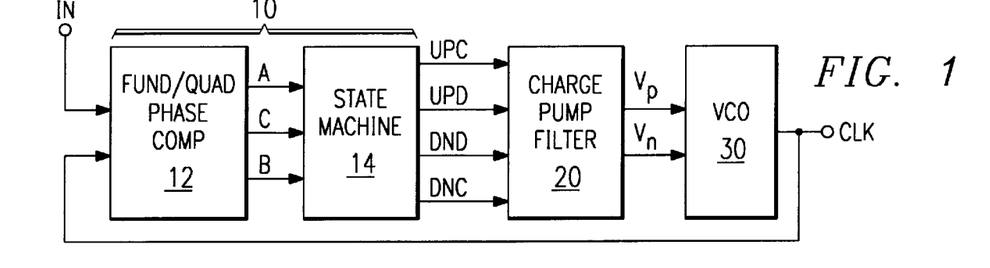
FIG. 1 is an electrical diagram, in block form, of a phase-locked loop circuit constructed according to the preferred embodiment of the invention.

Referring first to FIG. 1, an example of a phase-locked loop circuit constructed according to the preferred embodiment of the invention will be described. The phase-locked loop circuit of FIG. 1 is particularly useful for implementation into a single integrated circuit either as a stand-alone circuit or, alternatively, in combination with other functionality such as that implemented into modem VLSI devices. For example, the phase-locked loop circuit according to this embodiment of the invention may be implemented as "front-end" circuitry within a high performance microprocessor, such as a digital signal processor (DSP). Alternatively, the phase-locked loop according to the preferred embodiment of the invention may be realized as a combination of multiple discrete integrated circuits, if desired.

As illustrated in FIG. 1, the phase-locked loop according to this embodiment of the invention includes frequency/phase detector circuit 10, charge pump filter 20, and voltage controlled oscillator (VCO) 30, connected in sequence. Specifically, frequency/phase detector circuit 10 receives an input bitstream on line IN in combination with a clock signal on line CLK from the output of VCO 30; according to this embodiment of the invention, the clock signal on line CLK is a clock signal that is being generated, or "recovered", from the input bitstream on line IN. Frequency/phase detector circuit 10, according to this embodiment of the invention, includes fundamental/quadrature phase comparator circuit 12 for comparing the phase of the input bitstream to both fundamental and quadrature phases of the recovered clock signal on line CLK. Frequency/phase detector circuit 10 communicates the result of this comparison on lines A, C to state machine 14, as illustrated in FIG. 1.

Based on the phase relationship of the input signal to the recovered clock in a current cycle and in preceding cycles, state machine 14 generates signals on lines UPC, UPD, DND, DNC that are applied to charge pump filter 20 on lines $V_p$, $V_n$. According to this embodiment of the invention, charge pump filter 20 is a low-pass filter including a capacitor that is controllably charged and discharged in response to the signals on lines UPC, UPD, DND, DNC from state machine 14. The voltage on this capacitor is applied (either individually or in combination with a second voltage derived therefrom) to VCO 30 which, in turn, generates a periodic signal on line CLK. As is conventional in the art, the frequency of the signal on line CLK depends upon the magnitude of the voltage applied to VCO 30 by state machine 14. This signal on line CLK is applied as a feedback signal to frequency/phase detector circuit 10, for use in the frequency and phase comparison performed thereby.

In the operation of the phase-locked loop according to the preferred embodiment of the invention, as will be described in further detail hereinbelow, a signal on one of lines UPC, DNC charges or discharges, as the case may be, the capacitor in charge pump filter 20 in a high-gain manner during the initial stages of lock-in. The selection of whether to charge or discharge the capacitor is controlled by frequency/phase detector circuit 10, and depends upon the rotational direction of the phase relationship between the input bitstream on line IN and the recovered clock signal on line CLK. The recovered clock signal on line CLK is generated by VCO 30 responsive to the output of charge pump filter 20. Once the recovered clock signal on line CLK is coarsely locked-in to the input frequency, as indicated by a change in the rotational direction of the input/output phase relationship, state machine 14 will generate signals on one or both of lines UPD, DPD to charge and discharge, respectively, the capacitor in charge pump filter 20 at a significantly slower rate, to achieve and maintain both frequency and phase lock-in. Accordingly, the clock signal on line CLK is a periodic signal that is "recovered", or "extracted", from the input bitstream on line IN.

Figure 2:
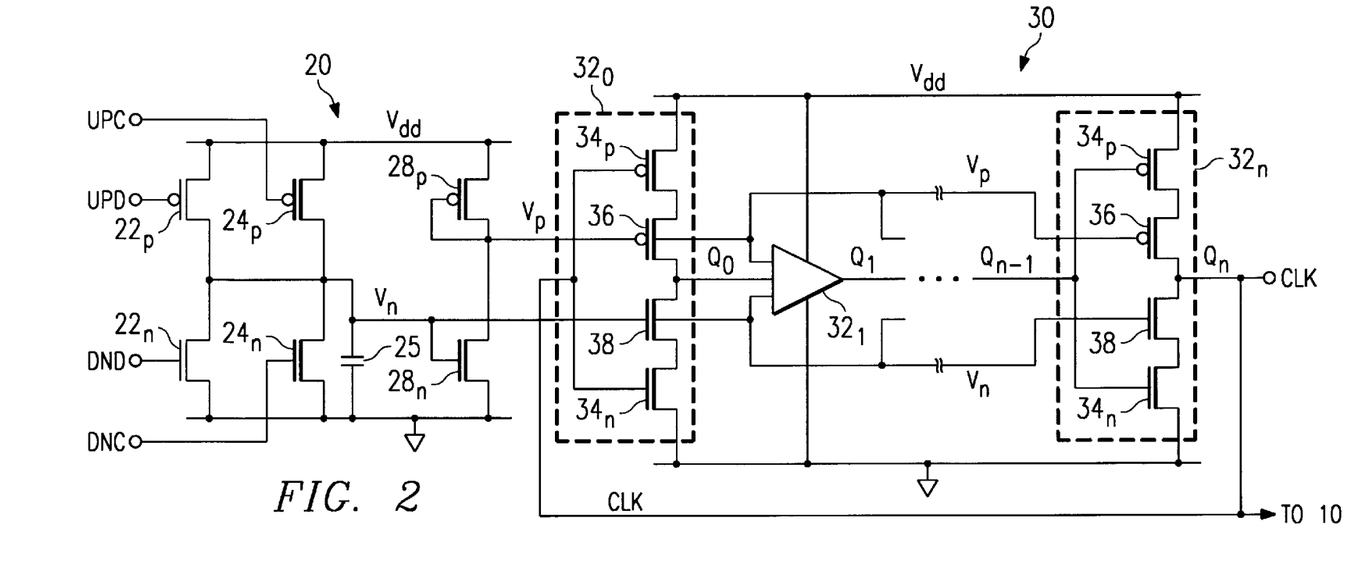
FIG. 2 is an electrical diagram, in schematic form, of a charge pump and voltage-controlled oscillator in the phase-locked loop of FIG. 1.

Referring now to FIG. 2, the detailed construction and interconnection of charge pump filter 20 and VCO 30 according to the preferred embodiment of the invention will now be described. Of course, other realizations of charge pump filter 20 and VCO 30 may be utilized in connection with the present invention.

Charge pump filter 20 includes, as noted above, capacitor 25 which has one plate biased to ground. The other plate of capacitor 25, at node $V_n$ in FIG. 2, is controllably charged and discharged by transistors 22p, 22n, 24p, 24n. Transistors 22p, 22n, 24p, 24n have their gates controlled by the voltage on lines UPD, DND, UPC, DNC, respectively, each of which is generated by state machine 14 to establish and modulate the voltage on capacitor 25 at node $V_n$. In this example, p-channel transistors 22p, 24p have their sources biased to power supply voltage $V_{dd}$, while n-channel transistors 22n, 24n have their sources at ground; the drains of transistors 22p, 22n, 24p, 24n are all connected together to capacitor 25 at node $V_n$. Additional series transistors, for example with their gates biased to their drains, may be included in each leg of charge pump filter 20, to control conduction through transistors 22, 24, as is known. Transistors 22p, 24p are each operable to charge capacitor 25 and raise the voltage at node $V_n$ when turned on, while transistors 22n, 24n are each operable to discharge capacitor 25 and lower the voltage at node $V_n$ when turned on.

According to this embodiment of the invention, however, transistors 22p, 22n are substantially weaker in their drive capability than are transistors 24p, 24n. For example, the gain of transistors 24p, 24n (preferably determined by their channel width/length ratio) may be significantly larger, such as ten times larger, than the gain of transistors 22p, 22n, respectively. This relationship permits lines UPC, DNC, when driven active, to rapidly charge and discharge, respectively, capacitor 25, and lines UPD, DND, when active, to slowly charge and discharge, respectively, capacitor 25. The dual rate of control of the voltage at node $V_n$ provides rapid and accurate lock-in of the phase-locked loop according to the preferred embodiment of the invention.

Capacitor 25 is connected, also at node $V_n$, to the gate of n-channel pull-down transistor 28. Transistor 28n has its source at ground, and its drain connected to the drain and gate of p-channel transistor 28p at node $V_p$; the source of transistor 28p is connected to power supply voltage $V_{dd}$. Through the operation of transistors 28p, 28n, the voltage at node $V_p$ will follow the voltage at node $V_n$, such that the voltage at node $V_p$ will fall as the voltage at node $V_n$ rises, and vice versa.

The voltages on nodes $V_p$, $V_n$ are forwarded to VCO 30, to control the frequency of oscillation of the recovered clock signal on line CLK as will now be described. VCO 30, in this embodiment of the invention, is arranged as an odd-numbered series of inverters $32_0$ through $32_n$ (i.e., n being even), the switching times of each of which are controlled by the voltages at nodes $V_p$, $V_n$ from charge pump filter 20. The input of each of inverters 32 is connected to the output of the preceding inverter, with the exception of inverter $32_0$ which receives the output clock signal on line CLK at its input. Given that the number of inverters 32 in VCO 30 is odd, VCO 30 operates substantially as a ring oscillator, with a frequency set by the switching times of inverters 32, and thus by the voltages on lines $V_p$, $V_n$ driven by charge pump filter 20.

By way of example, inverter $32_0$ includes p-channel transistor 34p and n-channel transistor 34n, the gates of which receive the state of line CLK (from inverter $32_n$). Inverter $32_0$ also includes p-channel transistor 36, with its gate receiving the voltage at node $V_p$, and n-channel transistor 38, with its gate receiving the voltage at node $V_n$. The source/drain paths of transistors 34p, 36, 38, 34n are connected in series between power supply voltage $V_{dd}$ and ground. Output node $Q_0$ of inverter $32_0$ is at the common drain connection between transistors 36, 38, and is driven to the logical complement of the state of line CLK at the gates of transistors 34p, 34n. The switching time of inverter $32_0$ will depend upon the voltages at nodes $V_n$, $V_p$. For example, a relatively high voltage at node $V_n$ will render transistor 38 relatively conductive; this voltage will pull node $V_p$ relatively low, which will also render transistor 36 relatively conductive. With transistors 36, 38 turned on relatively hard (i.e., having relatively little source/drain resistance), the switching time of inverter $32_0$ will be relatively fast, but with transistors 36, 38 turned on relatively slightly (i.e., having more source/drain resistance), the switching time of inverter $32_0$ will be relatively slow.

As noted above and as illustrated in FIG. 2 for inverter 32n, each of the remaining inverters $32_1$ through $32_n$ in VCO 30 are similarly constructed and operate similarly as inverter $32_0$. In this regard, each inverter $32_i$ in VCO 30 has an input, at the gates of transistors 34p, 34n therein, that receives output node $Q_{i-1}$ from preceding inverter $32_{i-1}$, and drives output node $Q_i$ at the drains of its transistors 36, 38 to a complementary state from that at its input. In addition, series transistors 36, 38 are controlled by the voltages at nodes $V_p$, $V_n$, respectively, so that the switching time of each inverter 32 is controlled in the manner described above for inverter $32_0$. Because the frequency of oscillation is determined by the time required for a transition to circulate through inverters 32, and thus by the sum of the switching times of inverters 32 in VCO 30, the voltage at node $V_n$ at capacitor 25 in charge pump filter 20 will control the frequency of the clock signal on line CLK. As will be described in detail hereinbelow, frequency/phase detector 10 controls the charging and discharging of capacitor 25, and thus the frequency of the clock signal on line CLK, in a particularly beneficial manner to obtain fast and accurate frequency lock-in.

Figure 3:
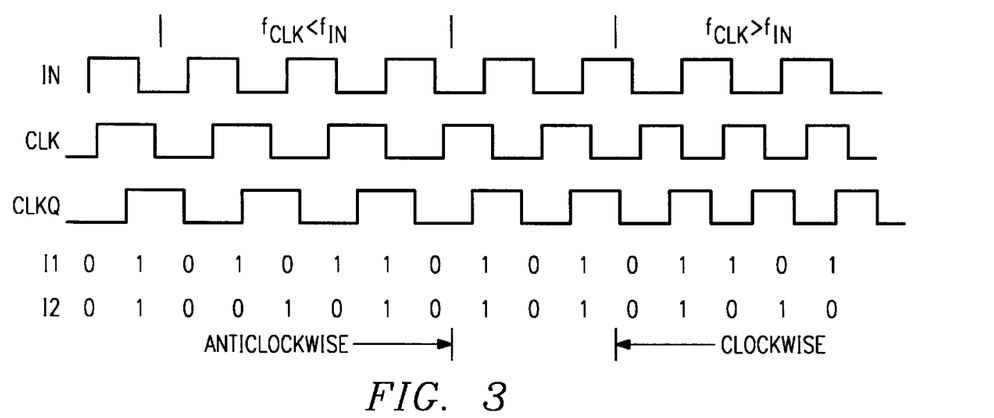
FIG. 3 is a timing diagram illustrating the potential relationship of an input bitstream to a clock signal recovered therefrom.

Referring next to FIG. 3, the concept of rotational frequency/phase detection, as utilized by the phase-locked loop circuit according to the preferred embodiment of the invention, will now be described. FIG. 3 illustrates an example of an input bitstream on line IN and its relationship with an example of a recovered clock signal on line CLK; in this example, the input bitstream on line IN corresponds to a series of "1" data states, and as such approximates a periodic signal. The clock signal on line CLK corresponds to a fundamental phase; FIG. 3 also illustrates, on line CLKQ, a quadrature phase (i.e., 90° lagging phase) of the clock signal on line CLK.

According to the preferred embodiment of the present invention, and referring back to FIG. 1, logic signals I1, I2 are generated by fundamental/quadrature phase comparator circuit 12 to correspond to the logic level of the clock signal on lines CLK, CLKQ, respectively, at the time of an edge (either rising or falling) of the input signal on line IN. FIG. 3 illustrates a series of logic levels for each of logic signals I1, I2 for the pulses of clock signals on line IN, CLK, CLKQ that are also illustrated therein.

Figure 4:
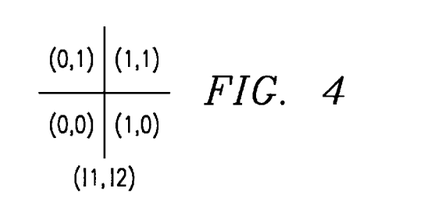
FIG. 4 is a graph illustrating the directionality of the relationship of the input bitstream to the recovered clock signal.

As described in the Wolaver reference discussed hereinabove, one may determine the relationship between the frequencies of the compared clocks (i.e., the polarity of the error frequency) by determnig the direction of rotation of the progression of values of the logic signals I1, I2 about the origin of the graph illustrated in FIG. 4. In this case, the compared clocks are the clock signal on line CLK and the input signal on line IN. FIG. 4 illustrates the quadrants associated with the paired values of logic signals I1, I2 corresponding to the states of the fundamental and quadrature phase of the clock signal on lines CLK, CLKQ respectively, with each edge of the signal on line IN. As is illustrated in FIG. 3, when the frequency $f_{clk}$ of the recovered clock on line CLK is less than the frequency $f_{IN}$ of the input signal on line IN, the rotation of the progression of paired logic signals I1, I2 is anticlockwise; for example, the progression of logic signals I1, I2 from the third to the fourth edges of the input signal on line IN is from (0,0) to (1,0), which is anticlockwise in the graph of FIG. 4. Conversely, when the frequency $f_{CLK}$ of the recovered clock on line CLK is greater than the frequency $f_{IN}$ of the input signal on line IN, the rotation of the progression of paired logic signals I1, I2 is clockwise, as evidenced by the progression of logic signals I1, I2 from the thirteenth and fourteenth edges of the input signal on line IN from (1,1) to (0,1), clockwise in the graph of FIG. 4. As is evident from these examples, clockwise and anticlockwise progressions are often separated by diagonal progressions (i.e., (0,1) to (1,0) and (0,0) to (1,1)), which may be ignored in determining the polarity of the error frequency.

Figure 5:
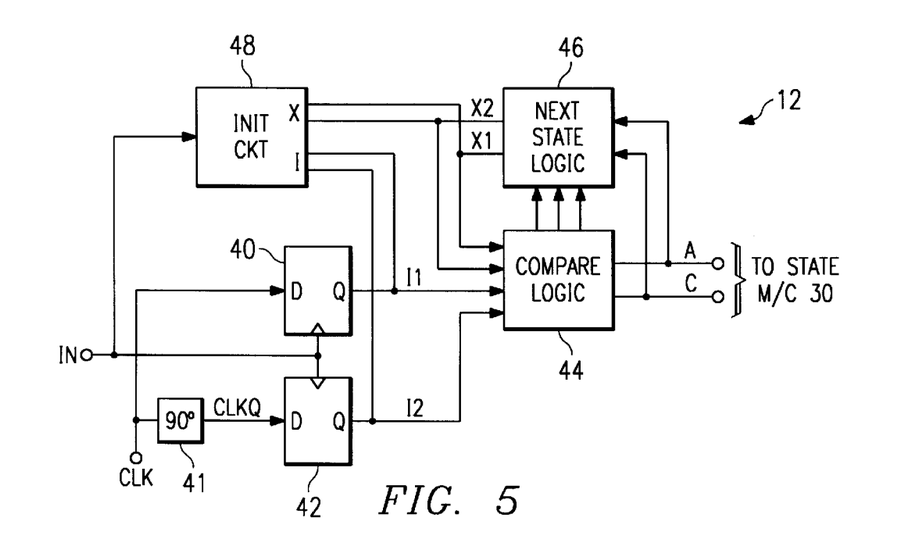
FIG. 5 is an electrical diagram, in block form, of the frequency and phase detector circuitry of the phase-locked loop circuit of FIG. 1.

Referring now to FIG. 5, the construction of fundamental/quadrature phase comparator circuit 12 will now be described in detail. As illustrated in FIG. 5, fundamental/quadrature phase comparator circuit 12 includes a pair of double-edge-triggered D-type latches 40, 42, each of which receives line IN at its clock input. Latch 40 receives line CLK at its D input and generates logic signal I1 at its Q output; latch 42 receives, at its D input, signal CLKQ which is generated from line CLK via 90° delay stage 41, and generates logic signal I2 at its Q output. Logic signals I1, I2, as generated by latches 40, 42, respectively, are applied to inputs of compare logic 44, along with logic signals on lines X1, X2 from next state logic 46, which correspond to the state of logic signals I1, I2 from a prior edge of the signal on line IN, as will be described hereinbelow. Compare logic 44 generates the results of the comparison of logic signals I1, I2 as generated from the most recent edge of the input signal on line IN with logic signals X1, X2, to determine if the progression is in a clockwise or anticlocawise direction. Compare logic 44 comm-nun ica tes the results of its comparison to state machine 30 on lines A, C; next state logic 46 also receives the state of lines A, C, as well as the state on line B and other signals from compare logic 44, based upon which it generates the next state signals on lines X1, X2 for application to compare logic 44 for the next input signal edge.

Fundamental/quadrature phase comparator circuit 12 also includes initialization circuit 48, which generates initial states of logic signals I1, I2, X1, X2 before a recovered clock signal on line CLK has been generated. According to the preferred embodiment of the invention, initialization circuit 48 simply initializes lines I1, I2, X1, X2 to arbitrary states, from which rotation of the frequency relationship on lines CLK and IN may be detected. For example, lines X1, X2 may be initialized to a "0" state and lines I1, I2 to a "1" state, corresponding to a diagonal frequency relationship rotation.

Figure 6:
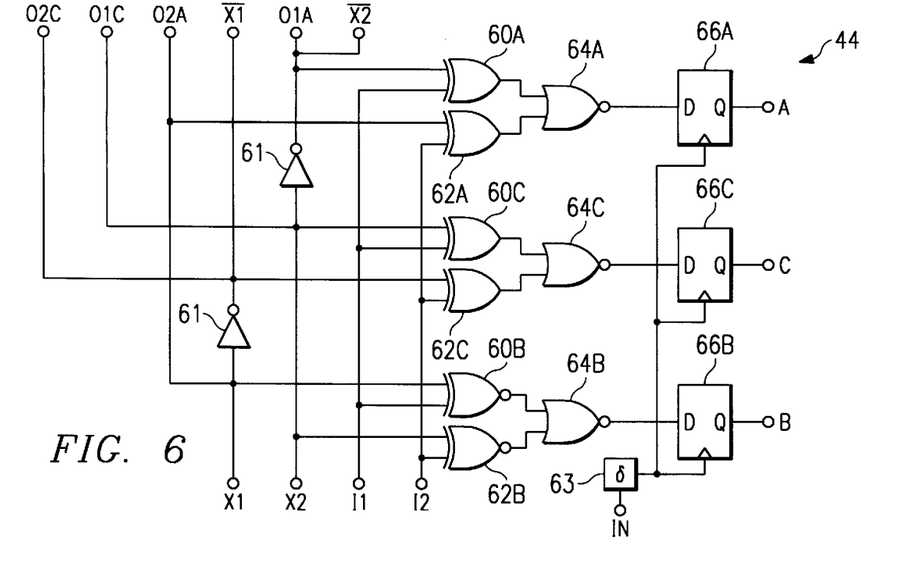
FIG. 6 is an electrical diagram, in schematic form, of compare logic in the frequency and phase detector circuitry of the preferred embodiment of the invention.

Referring now to FIG. 6, the construction of compare logic 44 will now be described in detail. As will be evident from the following description, compare logic 44 generates signals on lines A, C, B to indicate anticlockwise, clockwise, and diagonal rotations, respectively, according to the convention illustrated in FIG. 4. The signals on lines A, C will control state machine 30, which in turn will control the operation of charge pump filter 20 and VCO 30 to generate the recovered clock signal on line CLK. The diagonal signal on line B will be used by next state logic 46 to derive logic signals X1, X2 for the next edge of the signal on line IN.

Referring back to FIG. 4, one may readily derive the appropriate comparison logic to determine rotational direction of the progression of input signals from a comparison of most recent logic signals I1, I2 with the prior edge logic signals X1, X2. This relationship is as follows:

| Direction | | | |
|---|---|---|---|
| Clockwise | I1 = $\overline{X2}$ | AND | I2 = X1 |
| Anticlockwise | I1 = X2 | AND | I2 = $\overline{X1}$ |
| Diagonal | I1 ≠ X1 | AND | I2 ≠ X2 |

Progression to an identical state in successive edges of the input signal on line IN is not considered as a valid event, as this occurs when the frequency relationship of the input signal and the recovered clock signal is outside of the expected lock-in range.

An example of a logic realization of compare logic 44 according to the preferred embodiment of the invention is illustrated in FIG. 6. As shown in FIG. 6, compare logic 44 receives logic signals I1, I2, X1, X2 at inputs of exclusive-OR gates 60A, 62A, 60C, 62C, and at inputs of exclusive-NOR gates 60B, 62B. In this example, corresponding to the table hereinabove, exclusive-OR gate 60A receives logic signal I1 and the complement of logic signal X2 (from an inverter 61) at its inputs, exclusive-OR gate 62A receives logic signals I2, X1 at its inputs, exclusive-OR gate 60C receives logic signals I1, X2 at its inputs, and exclusive-OR gate 62C receives logic signal I2 and the complement of logic signal X1 (from an inverter 61). The outputs of exclusive OR gates 60A, 62A are applied to NOR gate 64A, which has its output in turn connected to the D input of double-edge-triggered latch 66A; similarly, the outputs of gates 60C, 62C are applied to inputs of NOR gate 64C, the output of which is connected to the D input of latch 66C. Exclusive-NOR gate 60B receives logic signals I1, X1 at its inputs, and exclusive-NOR gate 62B receives logic signals I2, X2 at its inputs; the outputs of gates 60B, 62B are applied to inputs of NOR gate 64B, the output of which is connected to the D input of latch 66B. Latches 66A, 66C, 66B are all clocked by clocked edges on line IN, after delay by delay stage 63 so as to permit the generation and propagation of the input signals on lines I1, I2. Latch 66A drives the signal on line A at its Q output, latch 66C drives line C with its Q output, and latch 66B drives line B with its Q output, each upon clocking by the delayed edge of the input signal on line IN.

In operation, compare logic 44 receives the current edge logic signals I1, I2, and the previous edge logic signals X1, X2, and performs the logical combinations indicated by gates 60, 62, 64. For example, the output of NOR gate 64A will be high responsive to logic signal I1 being at the same state as the complement of logic signal X2, in combination with logic signal I2 being at the same state as logic signal X1; in this event, the outputs of both of exclusive-OR gates 60A, 62A will be low, causing the output of NOR gate 64A to be high. This state will be clocked into latch 66A upon the delayed edge of the input signal on line IN, after which gate 66A will drive line A high, indicating an anticlockwise rotation (see FIG. 4). It is contemplated that those of ordinary skill in the art will comprehend the operation of compare logic 44 for the other progressions indicated hereinabove, and as such specific description of such operation will be omitted from this description.

As shown in FIG. 6, certain ones of the signals applied to gates 60, 62 are forwarded to next state logic 46. It is of course contemplated that one may simply store the current states of logic signals I1, I2 in latches, for use as logic signals X1, X2 in combination with the next edge of the input signal. However, given the high data rates and frequencies at which fundamental/quadrature phase comparison circuit I2 is required to operate, including up to on the order of GHz, direct generation of next state of logic signals X1, X2 from the current state logic signals X1, X2 is preferred.

Figure 7:
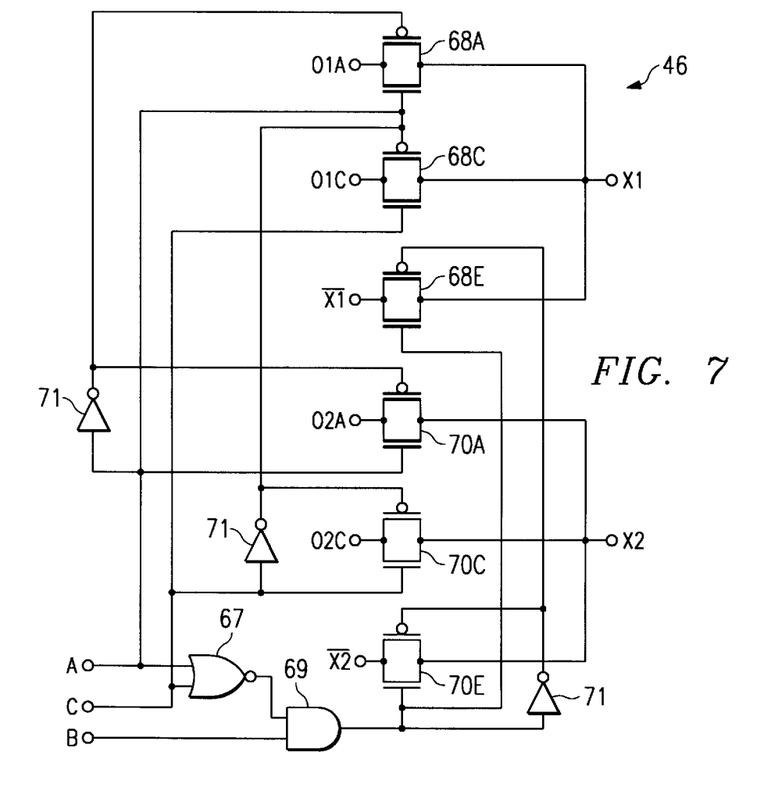
FIG. 7 is an electrical diagram, in schematic form, of circuitry for generating logic signals for a next state of operation in the frequency and phase detector circuitry of the preferred embodiment of the invention.

Referring now to FIG. 7 in combination with FIG. 6, the construction and operation of next state logic 46 will now be described in detail. Next state logic 46 is arranged as groups of pass gates 68, 70, for passing a selected input state as logic signals X1, X2, respectively. Each of pass gates 68, 70 is constructed as a CMOS pass gate, having parallel p-channel and n-channel transistors controlled by complementary signals (inverted states generated by inverters 71 in next state logic 46). In this example, pass gate 68A receives signal O1A (which corresponds to $\overline{X2}$, the complement of logic signal X2) from one input of exclusive-OR gate 60A, and is controlled by anticlockwise signal A. Similarly, pass gate 68C receives signal O1C (corresponding to logic signal X2) from the input of exclusive-OR gate 60C, and is controlled by clockwise signal C. Pass gate 68E receives $\overline{X1}$, the complement of logic signal X1, and is controlled by diagonal signal E. Signal E is generated by AND gate 69, which receives diagonal logic signal B at one input, and the output of NOR gate 67 at the other input. NOR gate 67 receives clockwise and anticlockwise signals C, A at its inputs; as a result, diagonal signal E is active responsive to diagonal signal B active in combination with both of anticlockwise and clockwise signals A, C, respectively, being inactive. The output sides of pass gates 68A, 68C, 68E are connected together in wired-OR fashion, and drive logic signal X1.

As illustrated in FIG. 7, logic signal X2 is generated substantially identically as logic signal X1 by way of pass gates 70A, 70C, 70E. Pass gate 70A receives signal O2A (i.e., logic signal X1) and is controlled by anticlockwise signal A, pass gate 70C receives signal O2C (i.e., $\overline{X1}$) and is controlled by clockwise signal C, and pass gate 70E receives signal $\overline{X2}$ and is controlled by diagonal signal E.

The operation of next state logic 46 in generating logic signals X1, X2 from its previous values will be readily apparent to the skilled reader. In the clockwise and anticlockwise cases, the logic signals X1, X2 are identical to the current input signals I1, I2, considering that the corresponding exclusive-OR gates have low level outputs (indicating equality at the inputs) in those cases. In the diagonal case, logic signals X1, X2 are simply inverted from the prior state. As such, logic signals X1, X2 are rapidly generated according to the preferred embodiment of the invention, in such a manner as to avoid latching of the current logic signals I1, I2, enabling robust operation at high data rates.

As described in the foregoing, and referring to FIG. 1, fundamental/quadrature phase comparator circuit 12 thus generates signals on lines A, C that indicate whether an anticlockwise or clockwise rotation of the phase relationship between the input signal on line IN and the recovered clock signal on line CLK has been detected. State machine 14 receives lines A, C and, based upon the current state and history of lines A, C, generates signals on one of lines UPC, UPD, DND, DNC that are applied to and control charge pump filter 20. State machine 14, in this preferred embodiment of the invention, includes sequential logic for generating these signals in a manner that will now be described in detail relative to FIG. 8.

Figure 8:
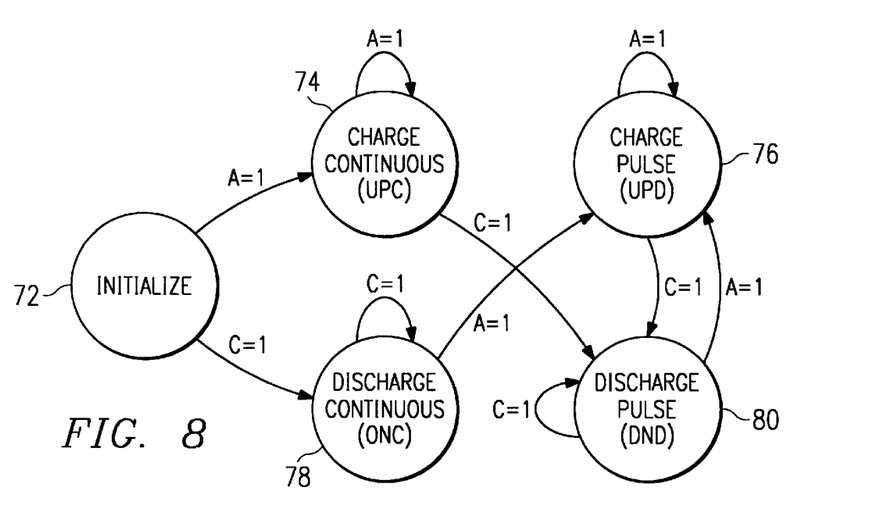
FIG. 8 is a state diagram illustrating the operation of a state machine in the frequency and phase detector circuitry of the preferred embodiment of the invention.

FIG. 8 is a state diagram illustrating the operation of state machine 14 in generating charge pump control signals on lines UPC, UPD, DND, DNC according to the preferred embodiment of the invention. It is contemplated that one of ordinary skill in the art, having reference to this description, will be readily able to realize the construction of state machine 14.

State 72 is an initialization stage in which state machine 14 resides prior to lock-in of the recovered clock signal from the input bitstream. During this time, as described above relative to FIG. 6, initialization circuitry 48 initializes the states of lines X1, X2, I1, I2; in addition, VCO 30 is preferably initialized by a local crystal oscillator to generate a signal on line CLK that is near the center of the lock-in range frequency range. State machine 14 remains in initialization state 72 until fundamental/quadrature phase comparator circuit I2 detects either an anticlockwise or clockwise phase relationship rotation, and indicates the same by an active state on lines A, C, respectively. In this example, a detected anticlockwise rotation, indicated by line A driven high (A=1), advances state machine 14 to state 74, while a detected clockwise rotation, indicated by line C driven high (C=1), advances state machine 14 to state 78.

In operation, state 74 is entered upon detection of an anticlockwise rotation, initiated by line A driven high. In state 74, state machine 14 effects fast charging of capacitor 25 in charge pump filter 20 by asserting an active state on line UPC. Referring back to FIG. 2, the continuous charging of capacitor 25 effected by state machine 14 in this embodiment of the invention refers to the application of substantially a steady state active low level on line UPC, which turns on p-channel transistor 22p to charge the plate of capacitor 25, at node $V_n$, from power supply voltage $V_{dd}$. In state 74, lines UPD, DND, DNC are held inactive (line UPD high, and lines DND, DNC low), so that transistors 22p, 22n, 24n are turned off. This charging serves to rapidly increase the voltage on node $V_n$ and decrease the voltage on node $V_p$, which in turn increases the frequency of the recovered clock signal on line CLK that is generated by VCO 30. The substantially steady state active low level on line UPC in state 74 may be effected simply by holding line UPC low, as will be described hereinbelow, or alternatively by pulsing line UPC to a low logic level at a relatively high duty cycle. State machine 14 remains in state 74 responsive to each repeated detected anticlockwise rotation (A=1); in addition, state machine 14 remains in state 74 (and in all states 72 through 80 of FIG. 8) after each event in which no rotation is detected (i.e., A=0 and C=0).

According to this embodiment of the invention, transition from state 74 only occurs upon detection of a clockwise phase relationship rotation, indicated by line C being driven active by fundamental/quadrature phase comparator circuit I2. In this event, state machine 14 makes a transition to state 80, as illustrated in FIG. 8. The detection of a clockwise rotation after substantially continuous charging of charge pump filter 20 in state 74 indicates an overcorrection of the increase of the frequency of the recovered clock signal on line CLK, to a frequency greater than that of the input bitstream on line IN. Accordingly, in state 80, state machine 14 generates an active signal on line DND, which in this case is a high logic level, beginning the phase correction of the clock signal generated by VCO 30. Referring back to FIG. 2, this signal turns on relatively weak transistor 22n with transistors 24p, 24n, 22p turned off, slowly discharging capacitor 25 toward ground, and reducing the voltage on node $V_n$. This action slowly reduces the frequency of the recovered clock signal generated by VCO 30. As illustrated in FIG. 8, state machine 14 remains in state 80 so long as no anticlockwise phase relationship rotations are detected (i.e., so long as only diagonal or additional clockwise rotations are detected).

State machine 14 makes a transition from state 80 to state 76 upon detection of an anticlockwise rotation, as evidenced by an active state on line A. In state 76, state machine 14 drives line UPD active (at a low logic level), which slowly charges capacitor 25 of charge pump filter 20 through weak transistor 22p, raising the voltage at node $V_n$ and slowly increasing the frequency of the recovered clock signal on line CLK. As illustrated in FIG. 8, state machine 14 remains in fine correction states 76, 80 to correct for anticlockwise and clockwise phase rotations, respectively, with active signals applied to lines UPD, DND, as the case may be. In this condition, detection of an anticlockwise rotation (A=1) causes state machine 14 to enter or remain in state 76 and issue an active signal on line UPD, while detection of a clockwise rotation (C=1) causes state machine 14 to enter or remain in state 80 and issue an active signal on line DND.

Conversely, if state machine 14 is in initialization state 72 and a clockwise phase relationship rotation is detected (C=1), state machine 14 will make an initial transition to state 78. In state 78, state machine 14 drives line DNC active (to a high logic level) to discharge capacitor 25 to ground through high-gain transistor 24n. State machine 14 remains in state 78 until an anticlockwise phase relationship rotation is detected (A=1), at which time state machine 14 makes a transition to state 76, beginning the fine, phase, correction process by slower charging of capacitor 25. The fine correction process of states 76, 80 then begins and continues, responsive to the detection of anticlockwise and clockwise phase rotations, respectively.

Figure 9:
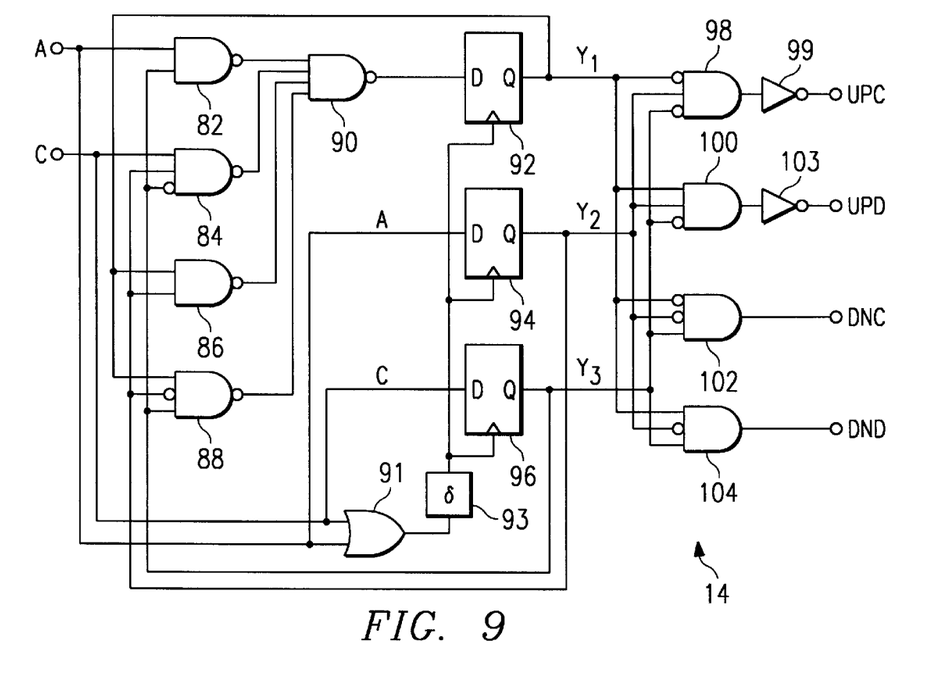
FIG. 9 is an electrical diagram, in schematic form, of the state machine in the frequency and phase detector circuitry of the preferred embodiment of the invention.

Referring now to FIG. 9, an exemplary realization of state machine 14 according to the preferred embodiment of the invention will be described. As noted above, this construction of state machine 14 is provided by way of example only, as it is contemplated that those of ordinary skill in the art having reference to this specification will be readily able to implement state machine 14 in alternative realizations.

As illustrated in FIG. 9, lines A, C are received by state machine 14 at the inputs of NAND gates 82, 84, respectively. NAND gates 82, 84, along with NAND gates 86, 88, constitute combinational logic that operate upon the anticlockwise and clockwise signals on lines A, C in combination with the prior state of state machine 14 as indicated on lines Y1, Y2, Y3 at the outputs of D-type latches 92, 94, 96, respectively. In this example, NAND gate 82 also receives line Y3 at another input, and NAND gate 84 receives line Y2 and the complement of line Y3 at its other inputs. NAND gate 86 receives line Y1 and line Y2 at its inputs, and NAND gate 88 receives line Y1, the complement of line Y2, and line Y3 at its inputs. The outputs of NAND gates 82, 84, 86, 88 are applied to respective inputs of NAND gate 90, which drives the D input of latch 92 from its output.

Latches 92, 94, 96 are all clocked by the logical OR of lines A, C (performed by OR gate 91), delayed by delay stage 93. Latch 94 receives line A at its D input, while latch 96 receives line C at its D input. Accordingly, in response to a pulse on either of lines A, C, latch 92 drives line Y1 to a level that is responsive to the logical combination performed by NAND gates 82, 84, 86, 88, 90 upon the current state of lines A, C and the prior state of state machine 14, while latches 94, 96 respectively drive lines Y2, Y3 with the state of lines A, C in this event.

The states of lines Y1, Y2, Y3 at the outputs of latches 92, 94, 96, respectively, are used by state machine 14 to generate the control signals on lines UPC, UPD, DNC, DNC. In this example, AND gate 98 drives line UPC (via inverter 99, considering that line UPC drives p-channel transistor 24p in charge pump filter 20) responsive to the logical AND of line Y2 with the complements of lines Y1 and Y3. AND gate 102 drives line DNC with the logical AND of line Y3 with the complements of lines Y1 and Y2. Similarly, AND gate 100 receives lines Y1, Y2 and the complement of line Y3 at its inputs, and drives line UPD with its output, after inversion by inverter 103 (considering that line UPD drives p-channel transistor 22p), and AND gate 104 receives lines Y1, Y3 and the complement of line Y2 at its inputs, and drives line DND at its output. As such, lines UPC, DNC, UPD, DND are driven in a substantially continuous manner when the states of lines Y1, Y2, Y3 indicate the appropriate state. As noted above, however, transistors 24 controlled by lines UPC, DNC are relatively strong relative to transistors 22 controlled by lines UPD, DND, and as such the rates of charging and discharging controlled by lines UPC, DNC are substantially larger than the rates controlled by lines UPD, DND.

Alternatively, it is contemplated that the charging and discharging of capacitor 25, and thus the control of VCO 30, may be effected in a continuous manner under the control of lines UPC, DNC, but in a discontinuous, or pulsed, manner under the control of lines UPD, DND (e.g., by including one-shot multivibrators at the output of AND gates 100, 104), to provide the different control rates according to the present invention.

Those of ordinary skill in the art will recognize that the operation of state machine 14, constructed according to the example of FIG. 9, corresponds to the state diagram of FIG. 8. For the sake of clarity, an example of the clock recovery operation of the phase-locked loop circuit of FIG. 1, constructed according to the preferred embodiment of the invention as described in FIGS. 2 and 5 through 10, will now be described with reference to FIG. 10.

Figure 10:
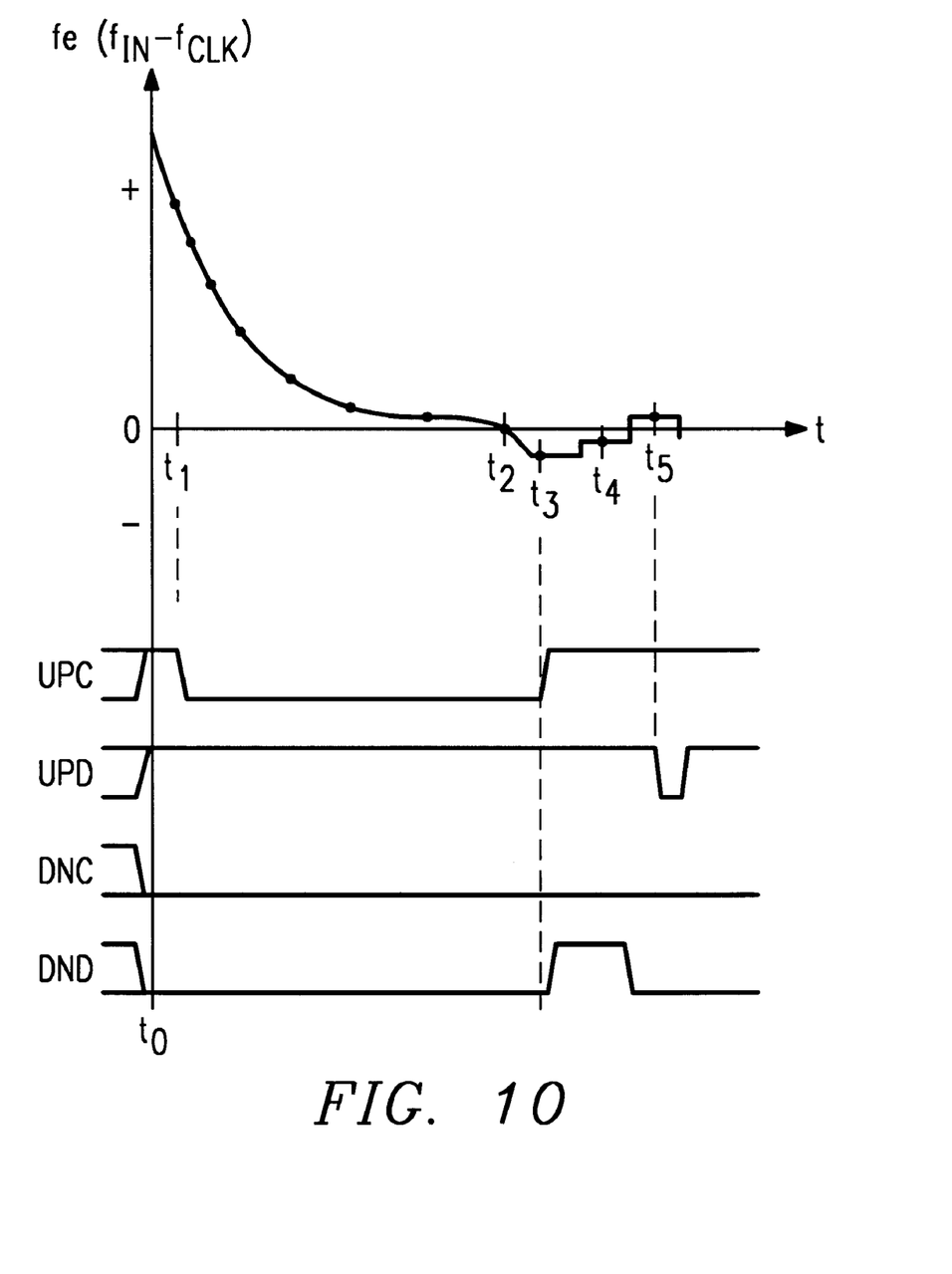
FIG. 10 is a timing diagram illustrating an example of the operation of the phase-locked loop circuit according to the preferred embodiment of the invention.

In this example, the initial frequency of clock signal CLK is lower than that of the frequency of the input bitstream on line IN. As illustrated in FIG. 10, at time $t_0$, the initial error frequency $f_e$ (which is the signed difference $f_{IN}-f_{CLK}$) is positive. In this initial condition, state machine 14 is in its initialized state 72.

Referring to the exemplary realization of state machine 14 illustrated in FIG. 9, in initialized state 72, lines Y2, Y3 in state machine 14 are initialized to low logic levels (for example by way of a reset signal, not shown for clarity), with neither anticlockwise nor clockwise rotations having yet been detected. Line Y1 is initialized to a high logic level; the output from NAND gate 90 is initialized to a low logic level, however, considering that each of NAND gates 82, 84, 86, 88 receive at least one low logic level at their inputs (lines A, C, Y2, or Y3) and thus cause high logic levels at their outputs. The combination of line Y1 high and lines Y2, Y3 low render each of the logical ANDs performed by AND gates 98, 100, 102, 104 false, placing each of control lines UPC, UPD, DNC, DND at an inactive state. The inactive states of lines UPC, UPD, DNC, DND at time $t_0$ is illustrated in FIG. 10.

VCO 30 is initialized, for example by way of a local crystal oscillator, to generate an initial clock signal on line CLK at a frequency that is preferably near the center of the frequency lock-in range. In this example, this initial frequency of line CLK is lower than that of the incoming bitstream on line IN.

In the example shown in FIG. 10, at time $t_1$, fundamental/quadrature phase comparator circuit 12 detects an anticlockwise rotation of the phase relationship between the signal on line CLK and the input bitstream on line IN. As noted above, in this event fundamental/quadrature phase comparator circuit 12 generates an active high level on line A, which is received by state machine 14.

Referring to the exemplary realization of state machine 14 illustrated in FIG. 9, a high logic level on line A at time $t_1$ maintains NAND gate 82 in its same state, as line Y3 is initialized to a low level. However, upon the delayed high logic level of line A propagating through OR gate 91 and delay stage 93, each of latches 92, 94, 96 are clocked to store the levels at their respective inputs. In this event, latch 92 receives the low logic level output from NAND gate 90, and drives its output on line Y1 low. Latch 94 will receive the high logic level on line A and drive its output on line Y2 high; line Y1 line Y3 remains low, as line C is low at this time. The combination of lines Y1, Y3 low and line Y2 high causes AND gate 98 to drive its output high which, after inversion by inverter 99, drives line UPC to its low, active state. In addition, NAND gate 82 will continue to drive a high logic level at its output, as will NAND gates 84 and 86, due to the state of line Y3 being low, and NAND gate 88 will continue to drive a high logic level at its output, causing the output of NAND gate 90 to remain low.

This operation is illustrated in the state diagram of FIG. 8, in which the active high level on line A causes a transition from initialized state 72 to state 74, resulting in an active (low) signal generated on line UPC. This transition of line UPC in response to the detected anticlockwise phase rotation, at time $t_1$, is illustrated in FIG. 10. Referring back to FIG. 2, the low logic level on line UPC turns on transistor 24p in charge pump filter 20, charging capacitor 25 to raise the voltage on node $V_n$ (and lower the voltage on node $V_p$); this increases the oscillation frequency of VCO 30, reducing the error frequency $f_e$ as illustrated in FIG. 10.

This condition remains in place for a series of subsequent comparisons performed by fundamental/quadrature phase comparator circuit 12, as shown in FIG. 10. Line UPC remains active, so long as either anticlockwise rotations (A=1) or diagonal (A=0 and C=0) rotations are detected, considering the stored states in latches 92, 94, 96. So long as line UPC remains low, as shown in FIG. 10, capacitor 25 in charge pump filter 20 continues to charge up, raising the voltage on line $V_n$ toward $V_{dd}$, and increasing the oscillation frequency of VCO 30 and thus the frequency of the clock signal on line CLK. At time $t_2$ in the example of FIG. 10, the frequency of the clock signal on line CLK has reached the frequency of the input bitstream on line IN, as evident by the zero crossover of the error frequency $f_e$. The frequency of the signal on line CLK continues to increase at this point, as line UPC remains at its active low level.

At time $t_3$, fundamental/quadrature phase comparator circuit 12 detects a clockwise rotation of the phase relationship between the signal on line CLK and the input bitstream on line IN. As discussed above relative to FIGS. 3 and 4, a clockwise rotation can occur when the frequency on line CLK exceeds that of the input frequency. In response, fundamental/quadrature phase comparator circuit 12 generates an active level on line C, which is received by state machine 14 and causes a state transition.

Referring to the exemplary realization of FIG. 10, the high logic level on line C is received by NAND gate 84. This signal, along with the high states of lines Y2 and the complement of line Y3, causes NAND gate 84 to drive a low logic level at its output, causing NAND gate 90 to in turn drive its output high. Upon the transition on line C propagating through OR gate 91 and delay stage 93, the high logic level on line C is latched by latch 96 and appears on line Y3, while the high logic level at the output of NAND gate 90 is latched by latch 92 and driven on line Y1; line Y2 is driven and held low at this time, as line A is low. The combination of lines Y1 and Y3 high and line Y2 low causes AND gate 104 to drive line DND, turning on transistor 22n and slowly discharging capacitor 25 therethrough to reduce the voltage on line $V_n$, thus decreasing the oscillation frequency of VCO 30.

As a result of the clockwise rotation detection indicated on line C, therefore, line UPC is driven to its inactive (high) state, and line DND is driven active (high). This corresponds to the transition from state 74 to state 80 in FIG. 8. This signal on line DND turns on transistor 22n, discharging capacitor 25 (at a relatively slow rate due to the weak drive of transistor 22n), and reducing the voltage at node $V_n$. As a result, the oscillation frequency of VCO 30, and thus the frequency of the clock signal on line CLK, is slowly reduced, as evident in FIG. 10 by the error frequency $f_e$ modulating in a positive direction after time $t_3$. This fine adjustment of the output clock signal is effectively an adjustment of the phase relationship of the input and output clock signals, as the frequencies of the signals are quite close at this point.

At time $t_4$, another clockwise rotation in the phase relationship is again detected (the error frequency $f_e$ still being negative at this time), which maintains a high level on line DND to continue to discharge capacitor 25, further reducing the oscillation frequency of VCO 30. Referring back to FIG. 8, state machine 14 remains in state 80 in this event.

In this example, however, the error frequency $f_e$ returns positive after the active signal on line DND after time $t_4$. At time $t_5$, fundamental/quadrature phase comparator circuit 12 detects an anticlockwise rotation of the phase relationship, and issues an active level on line A. This causes state machine 14 to make a transition from state 80 to state 76, (referring to FIG. 8), and to generate an active (low) state on line UPD to charge capacitor 25 through weak transistor 22p (referring to FIG. 2). Referring to FIG. 10, this signal on line UPD is caused by the high level on line A being latched by latch 94 and driven on line Y2, in combination with the low level on line C being latched by latch 96 and driven on line Y3. The state of line Y1 remains high at this time, and at all times in states 76, 80, as at least one of NAND gates 86, 88 ensures that one low logic level is presented to one of the inputs of NAND gate 90.

In this case, the signal on line UPD serves again to slowly raise the voltage at node $V_n$ in charge pump filter 20, slowly increasing the frequency of the clock signal on line CLK to approach the input bitstream frequency and phase on line IN. As the frequency of the signal on line CLK approaches the input frequency and phase on line IN, the frequency of phase rotations (either clockwise or anticlockwise) will decrease. As such, the time rate of change of the oscillation frequency of VCO 30 will decrease to a very low level. The recovered clock signal on line CLK may thus be considered as "locked-in" to the input bitstream frequency.

The phase locked loop circuit according to the preferred embodiment of the invention thus provides the important benefit of being able to quickly achieve lock-in of the recovered clock signal from the input bitstream. This rapid lock-in is obtained primarily by rapid charging or discharging beginning from initialization, until such time as the output clock signal is detected as overcorrected. Once the first overcorrection has been detected, additional correction is made by slower charging or discharging of the charge pump capacitor, thus achieving fine correction of the frequency and phase relationship of the output clock signal to that of the input bitstream.

For example, it is contemplated that the phase-locked loop circuit according to the present invention will remain in the rapid charge/discharge mode for only on the order of ten cycles in locking in to a 100 MHz input frequency, following which the fine, phase, correction will result in lock-in after only about thirty to forty additional cycles. This performance is a significant improvement over conventional phase-locked loop circuits.

In addition, the phase-locked loop according to the preferred invention is contemplated to also minimize the amount of jitter at small error frequencies, particularly in comparison to conventional phase-locked loops. The improved lock-in performance of the present invention is thus obtained without sacrificing accuracy or jitter.

As noted above, the preferred embodiment of the invention described herein is presented by way of example only, as various alternative implementations are also contemplated. For example, additional noise immunity may be provided through use of a "majority voting" arrangement in the detection of the phase relationship of the input and recovered clock signals during the initial stages of lock-in. According to this alternative arrangement, control of the charge pump may be carried out only upon receiving multiple instances of an anticlockwise or clockwise phase rotation (e.g., corresponding to two of the last three indications).

Further in the alternative, multiple charge pump capacitors may be provided to carry out the coarse and fine corrections, as opposed to the single charge pump capacitor as used by the preferred embodiment of the invention described hereinabove. In this alternative arrangement, the multiple charge pump capacitors may be of various sizes to accomplish charging and discharging of the VCO control voltage at different rates.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A phase-locked loop, comprising:
   a voltage-controlled oscillator, for generating an output clock signal having a frequency responsive to a control voltage;
   a charge pump circuit for generating the control voltage in response to charge/discharge control signals; and
   a frequency/phase detector circuit, comprising:
      a phase comparator circuit, having a first input for receiving an input signal, having a feedback input for receiving the output clock signal, for generating first and second indicator signals corresponding to the phase comparator circuit detecting first and second polarities of an error frequency between the input signal and the output clock signal; and
      sequential logic, for receiving indicator signals from the phase comparator circuit, and for generating a first charge/discharge control signal for controlling the charge pump circuit to change the control voltage applied to the voltage-controlled oscillator in a first direction at a first rate responsive to receiving a first one of the first and second indicator signals, and for then generating a second charge/discharge control signal for controlling the charge pump circuit to change the control voltage applied to the voltage-controlled oscillator in a second direction, at a second rate that is lower than the first rate, responsive to receiving the other one of the first and second indicator signals.

2. The phase-locked loop of claim 1, wherein the phase comparator circuit comprises:
   a delay stage having an input receiving a fundamental phase of the output clock signal and for generating a quadrature phase of the output clock signal;
   circuitry for generating a pair of current logic signals corresponding to states of the fundamental and quadrature phases of the output clock signal responsive to receiving a transition of the input signal; and
   compare logic for comparing the pair of current logic signals to a pair of prior logic signals, corresponding to states of the fundamental and quadrature phases of the output clock signal at a previous transition of the input signal, and for generating first and second direction indicator signals responsive to the direction of change of the current logic signals relative to the prior logic signals according to a predetermined sequence.

3. The phase-locked loop of claim 2, wherein the sequential logic is for:
   in a first state, applying a high-gain charge signal to the charge pump circuit;
   in a second state, applying a high-gain discharge signal to the charge pump circuit;
   in a third state, applying a low-gain signal to the charge pump circuit; and
   in a fourth state, applying a low-gain discharge signal to the charge pump circuit;
      wherein the sequential logic enters into and remains in the first state responsive to receiving a first instance of the first direction indicator signal from the compare logic, and enters the fourth state responsive to then receiving the second indicator signal from the compare logic;
      and wherein the sequential logic enters into and remains in the second state responsive to receiving a first instance of the second direction indicator signal from the compare logic, and then enters the third state responsive to then receiving the first indicator signal from the compare logic.

4. The phase-locked loop of claim 3, wherein the charge pump circuit comprises
   a capacitor;
   a first transistor, having a conduction path coupled between a power supply voltage and the capacitor, and having a control electrode coupled to receive the high-gain charge signal;
   a second transistor, having a conduction path coupled between the power supply voltage and the capacitor, and having a control electrode coupled to receive the low-gain signal, the second transistor having substantially weaker drive characteristics than the first transistor;
   a third transistor, having a conduction path coupled between a reference voltage and the capacitor, and having a control electrode coupled to receive the high-gain discharge signal; and
   a fourth transistor, having a conduction path coupled between the reference voltage and the capacitor, and having a control electrode coupled to receive the low-gain discharge signal, the fourth transistor having substantially weaker drive characteristics than the third transistor.

5. The phase-locked loop of claim 3, wherein the sequential logic comprises:

combinational logic, for receiving the first and second direction indicator signals and for receiving a plurality of feedback signals and for generating an output signal indicating whether one of the first and second direction indicator signals has been received since initialization;

a delay circuit, for generating a delayed signal based upon an occurrence of either of the first and second indicator signals;

a first latch for storing the output of the combinational logic, and having a clock input receiving the delayed signal;

second and third latches, for storing the state of the first and second indicator signals, respectively, each having a clock input receiving the delayed signal; and output logic, coupled to outputs of the first, second, and third latches, for generating the high-gain charge and discharge signals and the low-gain charge and discharge signals.

6. The phase-locked loop of claim 2, wherein the phase comparator circuit further comprises:

next state logic, coupled to inputs of the compare logic, for generating prior logic signals for use in connection with a next transition of the input signal.

7. A method of recovering a clock signal from an input bitstream, comprising the steps of:

initializing an output clock signal to an initial frequency;

periodically comparing the input bitstream to the initialized output clock signal to determine whether a frequency relationship therebetween is of a first or second polarity;

responsive to the comparing step determining that the frequency relationship is of the first polarity, controlling a voltage-controlled oscillator to change the frequency of the output clock signal in a first direction at a first rate;

then, responsive to the comparing step determining that the frequency relationship is of the second polarity, controlling the voltage-controlled oscillator to change the frequency of the output clock signal in a second, opposite, direction at a second rate that is less than the first rate.

8. The method of claim 7, further comprising:

after the step of controlling the voltage-controlled oscillator to change the frequency of the output clock signal in the second direction, controlling the voltage-controlled oscillator to change the frequency of the output clock signal in the first direction, at the second rate, responsive to the comparing step determining that the frequency relationship is of the first polarity.

9. The method of claim 7, wherein the steps of controlling the voltage-controlled oscillator comprise selectively charging and discharging a capacitor in a charge pump.

10. The method of claim 9, wherein the step of controlling the voltage-controlled oscillator in the first direction at the first rate comprises turning on one of a plurality of high-drive transistors.

11. The method of claim 10, wherein the step of controlling the voltage-controlled oscillator in the second direction at the second rate comprises turning on one of a plurality of low-drive transistors, the low-drive transistors having relatively weak drive characteristics relative to crresponding ones of the plurality of high-drive transistors.

12. The method of claim 7, wherein the comparing step comprises:

generating a quadrature phase of the output clock signal from a fundamental phase thereof;

responsive to each transition of the input bitsteam, generating a pair of current logic signals corresponding to the state of the fundamental and quadrature phases of the output clock signal at the time of the transition of the input bitstream;

comparing the pair of current logic signals to a pair of prior logic signals, the pair of prior logic signals corresponding to the state of the fundamental and quadrature phases of the output clock signal at the time of a prior transition of the input bitstream;

responsive to the comparing step detecting rotation of the current logic signals from the prior logic signals in a first direction along a predetermined sequence, issuing a first direction indicator signal; and responsive to the comparing step detecting rotation of the current logic signals from the prior logic signals in a second direction along the predetermined sequence, issuing a second direction indicator signal.

\* \* \* \* \*